United States Patent
Raymond et al.

(10) Patent No.: US 6,725,115 B2
(45) Date of Patent: Apr. 20, 2004

(54) DYNAMIC TESTING OF ELECTRONIC ASSEMBLIES

(75) Inventors: Douglas W. Raymond, Orinda, CA (US); Nelson R. Saldana, Pitssburg, CA (US); John F. Wood, Peabody, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/850,241

(22) Filed: May 7, 2001

(65) Prior Publication Data

US 2002/0072822 A1 Jun. 13, 2002

Related U.S. Application Data

(60) Provisional application No. 60/202,395, filed on May 8, 2000.

(51) Int. Cl.[7] .............................................. G06F 19/00
(52) U.S. Cl. ......................... 700/110; 382/145; 702/84
(58) Field of Search ................................. 700/109, 110, 700/100, 121; 382/145, 147; 702/84

(56) References Cited

U.S. PATENT DOCUMENTS

| | | | |
|---|---|---|---|
| 5,237,508 A | * | 8/1993 | Furukawa et al. .......... 700/100 |
| 6,408,219 B2 | * | 6/2002 | Lamey et al. ............... 700/110 |
| 6,421,122 B2 | * | 7/2002 | Nara et al. .................. 356/394 |
| 6,438,438 B1 | * | 8/2002 | Takagi et al. ............... 700/121 |
| 6,477,266 B1 | * | 11/2002 | Asar .......................... 382/147 |

* cited by examiner

Primary Examiner—Leo Picard
Assistant Examiner—Zoila Cabrera
(74) Attorney, Agent, or Firm—Teradyne Legal Dept..

(57) ABSTRACT

Method and apparatus for providing dynamic testing of electronic assemblies during their manufacture. A production line includes a communication network to interconnect assembly and inspection equipment. Events impacting the manufacture of the assemblies are communicated among the equipment, allowing the testing to be dynamically adjusted in response to events. Dynamic adjustment allows the process to quickly detect defects introduced by events. The concept is illustrated with a production line that has a pick and place machine and an inspection station. When an operator changes a reel of components at the pick and place machine, the inspection station will switch test programs to quickly verify that the correct reel has been loaded.

20 Claims, 3 Drawing Sheets

DYNAMIC TESTING OF ELECTRONIC ASSEMBLIES

RELATED APPLICATIONS

This application contains priority to provisional application No. 60/202,395 filed May 8, 2000.

BACKGROUND

This invention relates generally to the manufacture of electronic assemblies and more specifically to testing of the electronic assemblies to find manufacturing defects.

Traditionally, electronic assemblies, such as printed circuit boards, have been tested using an in-circuit test system. Such a system, often called a "bed of nails" tester, contains a test fixture with many probes that resemble a "bed of nails." The probes make contact to test points on the printed circuit board and the test system generates stimulus signals or measures responses through the probes. The goal of in-circuit testing was to make contact to enough points on the printed circuit board that the proper operation of every component could be verified and the connections between all components could also be tested.

In-circuit testing has the advantage of being very thorough and accurate. It has the disadvantage of requiring a specialized test fixture and a test program that can take a relatively long time to develop. But, it requires that there be test pads on the electronic assembly so that the probes can make contact to enough test points to run the test. As circuit boards became smaller, there was less ability to incorporate test points into the boards. Further, the cost and life cycle of products using circuit boards decreased, making it more important to develop test programs quickly. Simultaneously, testing of electronic components before they were mounted on the circuit improved, making it less important to be able to fully test the components after they were mounted to the board.

To meet the needs of low cost manufacturing of small circuit boards, a type of test equipment known as a Manufacturing Defect Analyzer (MDA) was developed. The goal of the MDA was not to test the operation of every component on the board. Rather, it was simply to verify that components were correctly attached to the board.

One type of MDA was used in conjunction with a bed of nails tester. However, the tester was configured to make contact to a reduced number of test points and the test program was simplified. DELTASCAN, provided by Teradyne, Inc of Walnut Creek, Calif., USA is one example of such a system. DELTASCAN applies stimulus to leads of a component on the board. The measured current will be different depending on whether that component is properly attached to the board. Though the probing does not indicate whether the component is properly functioning, it does indicate whether the component is present and properly attached to the board during manufacture.

The in-circuit tester could also be used in combination with non-contacting test techniques, such as FRAMESCAN sold by Teradyne, Inc of Walnut Creek, Calif., USA. This product capacitively couples a stimulus signal to a component on the board. If the component is properly installed, a predictable response can be measured at leads of that component. As with DELTASCAN, the operation of the component is not verified, but proper manufacture of the board can be verified with a simpler fixture and test program that a conventional in-circuit test.

Other approaches for creating MDAs are also used. One approach is called a "flying-prober." The flying-prober uses probes like in a bed of nails tester. However, the probes are not mounted in a fixture. Rather, the probes move around, allowing one probe to contact any point on the board. As a result, only a small number of probes are needed. The probes move around, making contact to test for shorts and opens on the boards. The flying-prober does not typically have enough probes to generate and measure all the test signals needed to verify the proper operation of a component on the board. However, particularly when used in conjunction with a technique like FRAMESCAN or DELTASCAN, the flying-prober can verify that the all the components are attached to the board. It can also do limited component verification, like measuring whether a resistor has the specified resistance or a capacitor has the specified capacitance.

Another approach for creating an MDA involves the use of automated optical inspection (AOI). In an AOI system, one or more cameras take pictures of the surface of the electronic assembly. Using computerized image processing, the AOI system can verify whether the specified components are in the correct places on the electronic assembly. It can also determine whether shorts have been created by structures in places where they should not be and can sometimes detect open circuits because the solder joints do not appear as they should for a good connection.

These MDAs operate by inspecting one region of the electronic assembly at a time. To fully test the board, even if just looking for manufacturing defects, the time to test the full board will be longer than it takes to manufacture the assembly. It is undesirable for the manufacturing equipment to sit idle while the assemblies are being tested. To avoid this problem, manufacturers use various test strategies. In some cases, the manufacturer will use "off line" testing. As the assemblies are manufactured, they are queued up for testing. This allows the manufacture to proceed at the maximum rate possible without stopping for testing.

Another approach is to use the MDA equipment "online," meaning that the equipment tests the assemblies at the same rate that they are manufactured. However, to account for the lower rate of one MDA, multiple MDA devices would be needed to handle all the assemblies being made. More often, though, the manufacturer does not want to make a large capital investment in test equipment to fully test every assembly. Rather, the manufacturer will balance the rate of manufacture and testing by testing only portions of the assemblies manufactured. This is called "sampling." With sampling, it is assumed that the manufacturing process will produce similar results for boards made at similar times. Thus, all the assemblies manufactured close together in time are likely to have the same defects. Thus, if the defects are likely to appear in the sample.

One way for sampling is to do a thorough test on a board, but to skip testing of the other boards being manufactured while that test is being completed. Another way to sample is to inspect only portions of each board. As successive boards are manufactured, a different region of the board is inspected. But, every region of some board will be inspected.

A drawback of a sampling approach is that, it might take a while until a problem with the manufacturing process is detected and corrected. In this time, many tens or hundreds of assemblies might be manufactured. Those assemblies would either have to be discarded or reworked to correct the defect. Either approach is expensive and undesirable.

SUMMARY OF THE INVENTION

With the foregoing background in mind, it is an object of the invention to provide a system for manufacturing electronic assemblies that reduces the number of assemblies that must be reworked or scrapped.

The foregoing and other objects are achieved in a manufacturing operation that employs dynamic testing. A manufacturing defect analyzer is linked to an assembly device. Events in the assembly device are communicated to the manufacturing defect analyzer and cause the manufacturing defect analyzer to change the method of sampling to increase the probability that a manufacturing defect will be quickly detected.

In a preferred embodiment, the manufacturing defect analyzer is linked to a pick and place machine that installs components on the electronic assembly from reels of components. Each time a reel is changed, the specific reel changed is communicated to the manufacturing defect analyzer. The manufacturing defect analyzer will test that the components dispensed from that reel match the specified components.

In an alternative embodiment, the event causes assemblies to be routed to a different MDA while the process is verified. In one embodiment, an AOI type MDA is used for normal inspection and a flying prober is used after a manufacturing process change.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
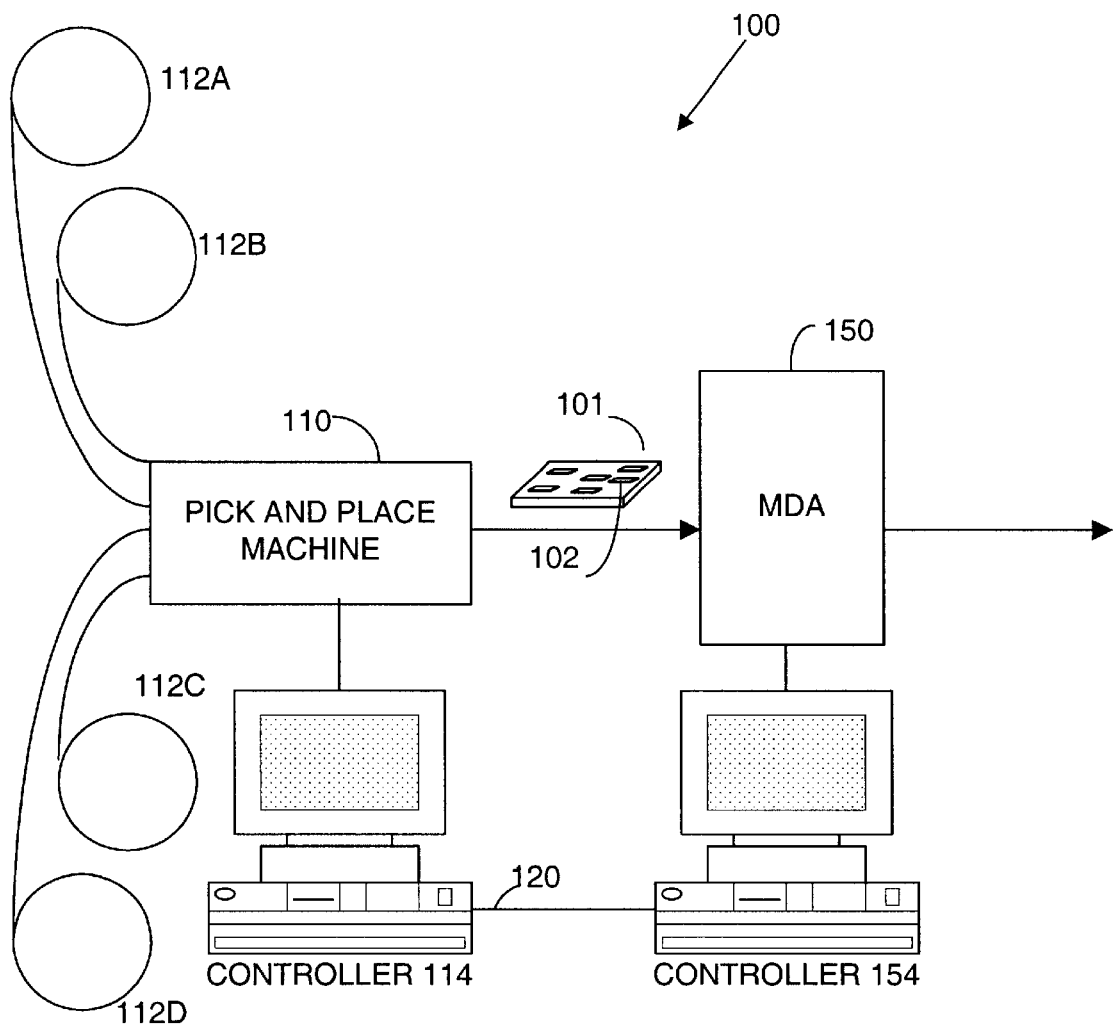
FIG. 1 is a simplified schematic of a manufacturing line according to a preferred embodiment of the invention.

FIG. 1 shows a production line 100 for making an electronic assembly.

In the illustrated embodiments, a printed circuit board will be used as an example of an electronic assembly. However, it will be appreciated that the electronic assembly could be such things as a multi-chip module (MCM) or other devices assembled from electronic components.

Also, it will appreciated that FIG. 1 is a simplified illustration of a portion of the production line for the purpose of describing the invention. One of skill in the art will understand that much more equipment might be needed to manufacture or route electronic assemblies while under production. For example, a production line making a printed circuit board might have several stages. A bare board might be brought into the process. Then, solder paste might be applied to the board in locations where components are to be attached. Then, components might be placed in the solder paste. After that, the solder is heated, causing it to reflow and solder the components to the board. Testing or inspection might be done at any stage in the manufacturing process, and is often done at several stages. The specific equipment and testing locations described herein should be taken as examples only.

Production line 100 includes an assembly machine. In the illustrated embodiment, the assembly machine is a pick and place machine 110. As is known in the art, a pick and place machine takes the printed circuit and places electronic components on it. Often, it places the components in solder paste that has already been applied to the board.

Pick and place machine 110 has a controller 114 associated with it. Controller 114 is shown to be a stand-alone device. However, this is just for illustration, because the controller could be an integral part of the machine. Controller 114 receives operator inputs, such as start and stop manufacturing. It also monitors the status of the machine and communicates status information to a human operator. For example, controller 114 monitors the supply of components available to the machine and notifies the operator when components have run out.

Controller 114 also includes communication software and hardware. It can electronically send and receive information about events to other controllers in the production line 100 or elsewhere in the factory. As will be described later, one function of controller 114 is to send information about events that allows for the tests performed on the printed circuit boards to be dynamically changed. Various types of conventional communication software and hardware are known. Examples of suitable links are an RS-232 interface or an SECS/GEM.

Pick and place machine 110 includes one or more magazines that store components to be placed on the board. In the illustrated embodiment, the magazines are in the form of reels 112A . . . 112D. For example, resistors and capacitors that are attached to printed circuit boards are often attached to a carrier strip that is wound on a reel. The manufacturer of the printed circuit board buys the components in this form. Other types of magazines might be used. For example, some components come in trays.

FIG. 1 indicates four reels 112A . . . 112D are available to pick and place machine 110. However, a typical printed circuit board might have ten or more different types of components. As a result, in a factory, there will be several types of reels available. Unfortunately, this allows for errors that can introduce manufacturing defects.

When a reel runs out, a new reel is loaded, often by a human operator. If the operator installs a reel with the wrong type of component, manufacturing defects will be introduced because a certain type of component will be attached to the wrong locations on the board. In a conventional assembly process, this error will eventually be detected by inspection equipment that receives the boards after the pick and place machine. However, it would be desirable for the error to be discovered quickly, before too many boards are made.

To expedite the discovery of an error following an event that leads to a change in the manufacturing process, controller 114 sends a message to controller 154, alerting controller 154 of the event. Controller 154 controls an inspection machine. In the illustrated embodiment, the inspection machine is a manufacturing defect analyzer (MDA) 150. Controller 154 causes MDA 150 to run an inspection program that is intended to quickly find any defect likely caused by the event. TABLE I gives an example of the sort of information that might be contained in such a message.

TABLE I

Message From: Assembly Machine 10653
Message To: Flying Prober #292.01.01.87
Event: Reel Change
Board Part Number: 38-662-22
Reel: 112A
Component Part Number: 91-563-22
Component Ids: R746, R165, R555, R278
Starting at Ser. No.: 16556

In the example of TABLE I, various message fields are listed. These fields might be encoded into a message in various ways and many ways of encoding messages are known in the art. The "Message From" field indicates the source of the message. In the example, identifiers are assigned to pieces of equipment connected via the computer network in the factory. In the example, the message originates from equipment such as assembly machine 110.

The second field in TABLE 1 is the destination address. As mentioned above, the equipment connected to the factory network would likely be assigned addresses, which could be used to route the message to the equipment that needs to react to the event. Many ways are known to appropriately route information in a computer network. One way is to include a destination address of one or more machines in the message. To create such a message, it is necessary for the equipment originating the message to be programmed with information that indicates which other pieces if equipment will change its programming based on the event. As an alternative, though, each message could be received by each piece of equipment on the factory network. The equipment could examine the message and determine whether it was programmed to take action when such an event occurs.

The type of event being signaled by the message is indicate in the field labeled "Event." In the example, the event field indicates that a reel has been changed. Various other types of events, such as a jam or manufacturing problem, could be indicated by the value entered in this field of the message.

The next field gives additional details on the event. In this field, a Board Part Number is indicated. The board part number indicates the type of board being manufactured at the time. Some production lines produce several different types of boards. Different test programs might be necessary depending on the type of board being produced. Thus, this information can be used as a further criteria to select an appropriate test program.

The next field describes the magazine for parts affected by the event. In this case, the parts are being derived from reel 112A.

The next field describes the specific part affected. In this case, the part is 91-563-22. This part number might, for example, correspond to a resistor of 20 MegaOhms. The next field indicates the components affected by the event. Often, each component on a printed circuit board is given a unique component identification number. Thus, during the manufacture of a board of type 38-662-22, reel 112A supplies components that are placed on the board at locations identified as R746, R165, R555, R278.

The last field indicates the serial number of the first board affected by the event. Often, in a manufacturing setting, the boards are given serial numbers, which are coded onto the boards such as by using a bar code label. In this way, the various machines that process the board can read the bar codes to track a particular board through the manufacturing process. In this case, the assembly machine might read the serial number of the next board to be processed when an event occurs. The inspection equipment could also read serial numbers and identify when that board reached the inspection station. This would be useful, for example, if there was a delay between assembly and inspection of the board such that, at the time of the event, several boards had already been assembled and were waiting for inspection.

It should be appreciated that the some of the information in the message is redundant or could be derived in other ways. Thus, TABLE I is provided for illustration only. For example, an inspection system could be programmed to inspect components without being provided with specific component ids based on the component part number. Also, it is possible that the factory automation system could identify the board affected by any event simply by maintaining counts on boards manufactured or inspected. Or, a system of markers might be used to indicate which board is the first one impacted by the change.

Regardless of the specific format in which the event is communicated to the inspection equipment, the inspection equipment can alter the inspection program based on the event. For example, MDA 150 might be a flying prober machine. In ordinary conditions, MDA 150 might be configured to measure the resistance of resistors in a one inch square sample region of each board. A different one inch square sample region might be inspected on successive boards. In this way, samples covering the entire board would eventually be inspected. For example, if the board had 100 square inches, after 100 boards were tested, the entire board would be sampled.

The drawback of sampling the board in this fashion is that, if an event introduces a defect in a certain region of the board, it will likely take multiple samples until that defect is discovered. Therefore, when controller 154 receives from controller 114 an indication that an event has occurred, controller 154 changes the test program executed by MDA 150 to rapidly discover whether an error has been introduced following the event. Preferably, an error would be discovered with less than five samples. More preferably, the error would be revealed by testing on a single sample. Such would be the case if the message, as in TABLE I, included a serial number of the first board to be affected by the event so that the MDA 150 could adapt to test that part with an appropriate program to test for errors that might be been introduced by the event.

For example, if controller 114 detects that reel 112A is empty. Controller 114 signals a human operator that reel 112A needs to be replaced. When reel 112A is replaced and manufacture of new boards begins, controller 114 sends a message to controller 154. Controller 154 causes MDA 150 to run a program that measures the values of the components that have been installed from reel 112A. MDA 150 will quickly determine whether the correct type reel has been installed at 112A.

For example, reel 112A might contain resistors that have a nominal value of 20 megaOhms. Those resistors should be installed at location 102 on a printed circuit board 101 manufactured by pick and place machine 110. When controller 154 receives notice that reel 112A has been replaced, it controls MDA 150 to measure the resistance of the component at location 102 on the printed circuit boards. If the resistance measures 20 megaOhms, it has been verified that the event has not caused the manufacturing process to change.

However, if the component at location 102 has the wrong value, likely the wrong reel has been loaded at 112A. Controller 154 can signal a process problem that leads to correction of the problem. One way that controller 154 can signal a process problem is by sending a message back to controller 114. Controller 114 can pause the assembly operation and signal the human operator to check the type of reel loaded at 112A.

Figure 2:
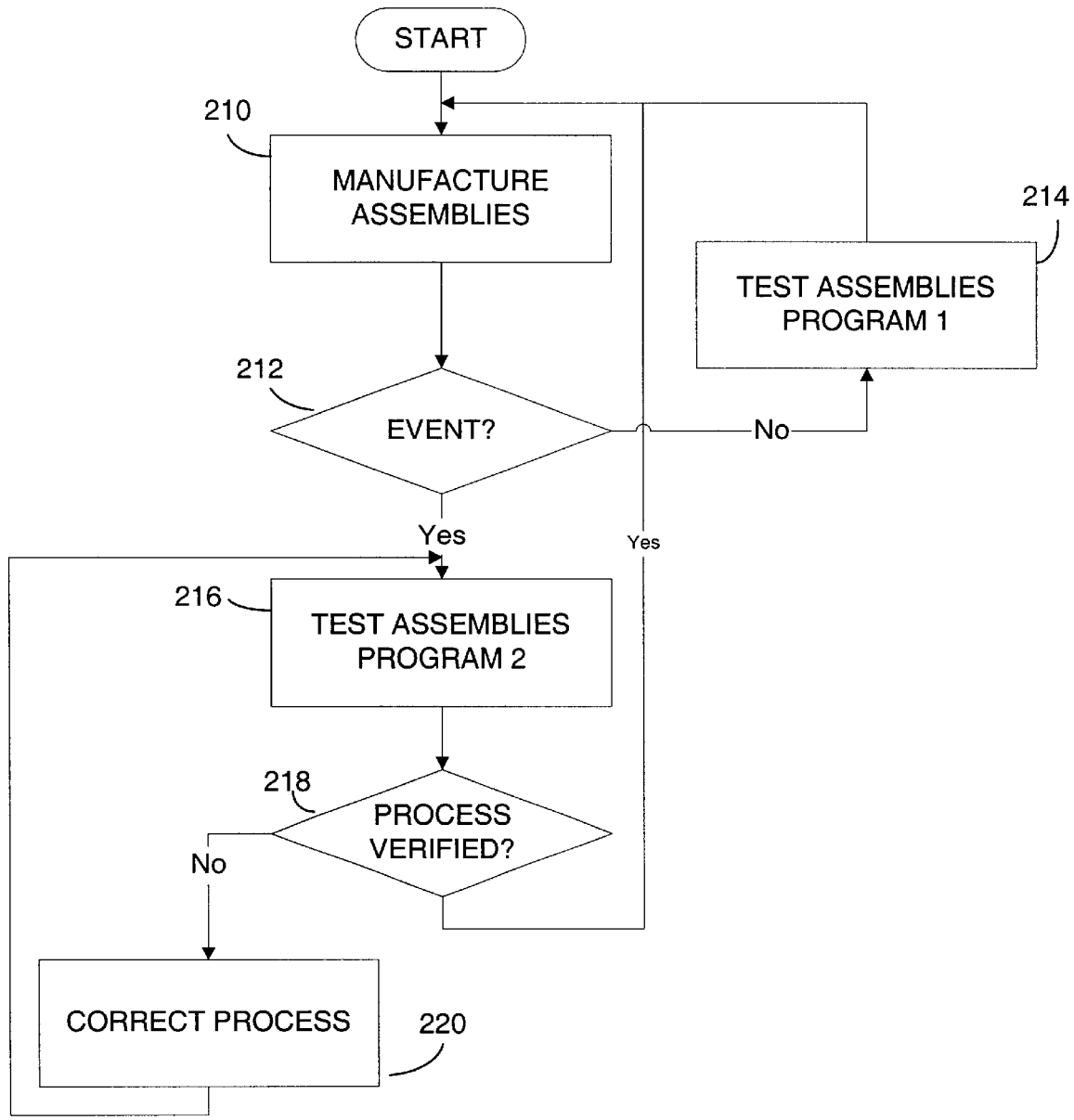
FIG. 2 is a flow chart of a dynamic test process according to the invention.

FIG. 2 illustrates the process of manufacturing electronic assemblies. At step 210, the assemblies are manufactured. Step 210 could represent a full manufacturing operation or could represent a portion of the assembly operation following which a test or inspection step is corrected. The specific type of equipment used for manufacture is not important for the invention.

At step 212, if there is an event that could potentially impact the manufacturing operation, the process flow is diverted. The event could be triggered by the manufacturing equipment, such as when a reel change is made. Or, the event could be triggered by inspection equipment, such as by signaling that an unusually high percentage of assemblies have a defect relating to a particular component or process step. Whether an event has been triggered can be communicated among the equipment in the manufacturing process in many ways. Examples of some of the ways include broadcast messages over a computer network, messages addressed to specific equipment over a computer network; storage of a "flag" or other data value in a central memory location accessible to the control equipment for the process equipment.

When no event is present, the process continues at step 214. At step 214, test program 1 is executed. Test program 1 is likely to be a sampled program that tests portions of each board. The process continues in a loop through steps 210, 212 and 214, until an event is detected.

Once an event which could impact the manufacturing process occurs, the process proceeds to step 216. At step 218, test program 2 is run. This test program is designed to determine whether the event has caused a defect in the manufacturing process. The specific method of operation of program 2 will depend on the event detected. For example, where the event is the change of a reel of resistors, the test program might measure the resistance of all components on the assembly dispensed from that reel. Alternatively, when the event relates to a change in a part of the process where solder paste is dispensed, test program 2 might make additional inspection of the solder paste deposited on the board, perhaps from multiple angles to determine the volume of solder paste that has been dispensed as well as the height, width and placement of the solder paste. It should be appreciated that test program 2 may be dynamically selected based on the specific event.

A step 218, a check is made whether the process has been verified. If program 2 has found no unusual errors or no unusually high rate of errors, the process will be considered validated. Once the process is validated, the process returns to the normal manufacturing loop of steps 210, 212 and 214.

If the process is not validated, the process continues to step 220 where the process is corrected. The specific actions taken to correct the process depend on the nature of the process and the level of automation in the process. At one extreme, the correction might be to simply send an alert to a human operator indicating that there is a problem with the process. At a higher level of automation, the correction might be to signal the assembly equipment to stop using a particular reel that contains suspect components or to run a calibration sequence or cleaning routine to self-correct the defect.

Alternatively, the correction might be to segregate all assemblies made until the process problem is corrected. Segregating the board will simplify repair later.

Another process correction that might be made at step 220 is to change the normal test program. Such would be useful when it appears as if the event has triggered a change in the process that does not necessarily result in a defect. Such might occur, for example, if a component is bought from a different supplier and looks different than prior components, but otherwise performs adequately. In this case, the component might not match any component programmed into the library of the inspection equipment. If it is determined that a particular component being installed on a printed circuit board is not in the library of test programs in the inspection equipment, an effort might be made to determine whether the component is similar enough to an existing component for an inspection routine in the library to adequately test for defects. Thus, the correction step 220 would simply change the normal inspection program.

Or, if it is determined that the new component does not match any inspection routine in the library of inspection routines of the inspection equipment, parameters to make an inspection routine might be stored in the library and used to make an inspection routine for that part. In this case, the "problem" with the process is that the inspection equipment is not adequately programmed. In addition to adjusting the inspection routine, the corrective action might include sending an alert to a human operator to correct the programming.

As a further alternative, where it is determined that a change has led to a component not being fully inspectable, the process correction might be to modify the test program to ignore the appearance of that part when determining whether an assembly has a manufacturing defect. In this way, the assembly process can continue without building up a large number of rejected boards that have to be later processed.

Figure 3:
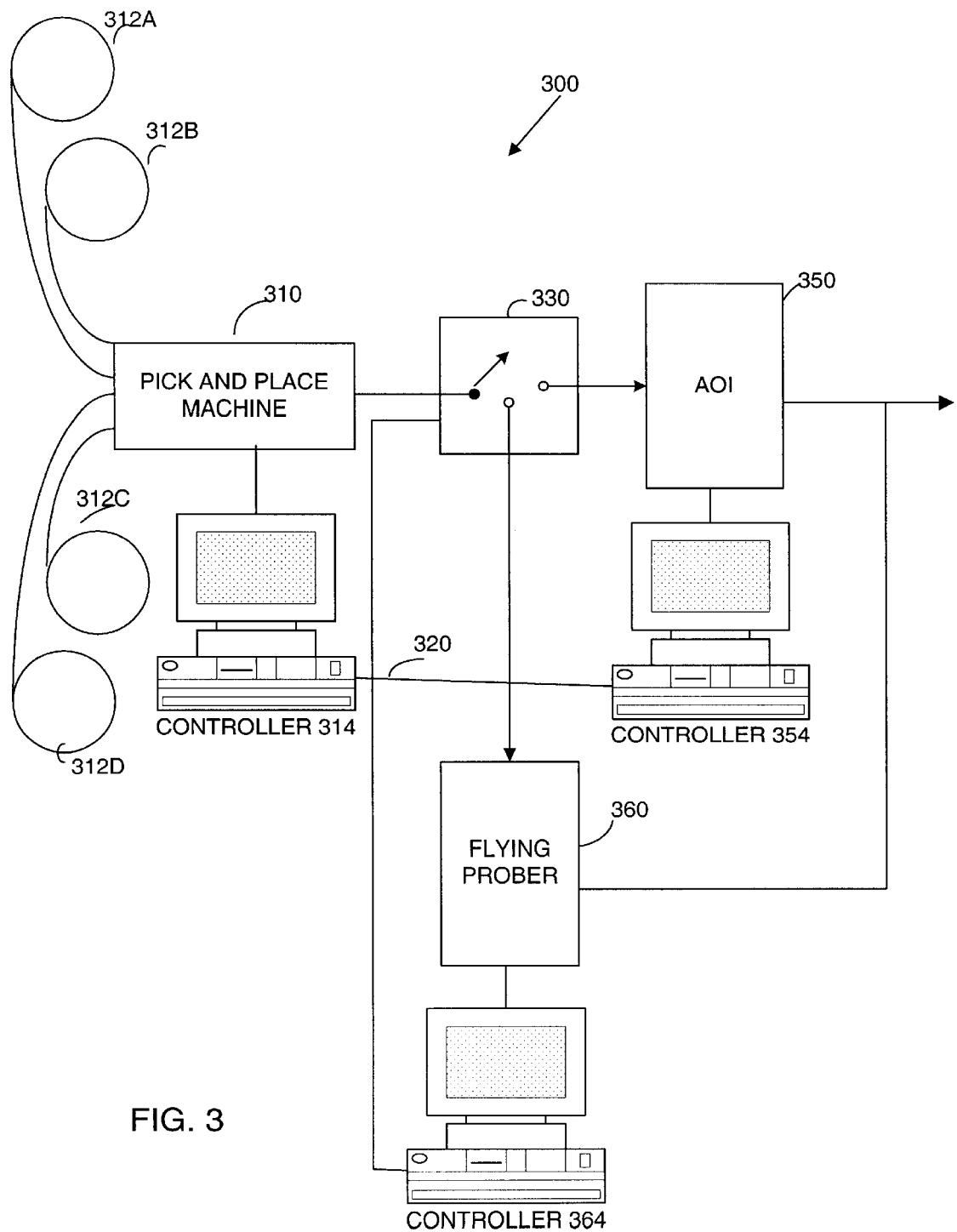
FIG. 3 is a simplified schematic of a manufacturing line according to an alternative embodiment of the invention.

FIG. 3 shows an alternative embodiment. In this manufacturing process, pick and place machine 310 is used as an example of an assembly machine. However, the inspection machine is made up of two different pieces of equipment: AOI system 350 and flying prober 360.

Switch 330 interconnects pick and place machine 310 to either AOI system 350 or flying prober 360 such that an electronic assembly can be inspected by either machine. Switch 330 represents a device that can divert the flow of assemblies during the manufacturing operation. Where the assemblies are moved through the process on conveyors, switch 330 represents a shunt or similar structure in the conveyor. Such devices are known in the art.

Here switch 330 is also connected to computer network 320 and includes computer controlled circuitry that allows the position of switch 330 to be controlled based on messages sent over network 320. Thus, switch 330 can be used to route assemblies for inspection by AOI system 350 or flying prober 360. Thus, it provides an alternative way to change the inspection program in response to an event. In particular, when an event is detected, boards might be diverted to flying prober 360 for inspection.

One example of the process that might be performed with production line 300 involves a reel change. Assemblies might normally be inspected using AOI system 350. AOI system 350 might be programmed only to verify that a component is present. But, to allow a high throughput on the inspection process, it would not attempt to read markings on the part or otherwise attempt to determine that the correct component is in place. But, whenever a reel change occurs, an assembly might be routed to flying prober 360. Flying prober 360 might make electrical measurements that would verify the value of the component on the board.

It should be appreciated that the number and arrangement of different types of inspection equipment could be varied. For example, switch 330 could come after AOI unit 350 to allow both an AOI and a flying prober inspection of the board.

Having described embodiments, numerous alternative embodiments or variations might be made. For example, it was described that an event, such as the changing of a reel of components, can trigger the need to run a different test program. Changing of the reel is an example of the type of event.

It should be appreciated that a reel change might not instantly introduce a change in the process. For example, an assembly machine might have multiple reels with the same type of part, allowing one reel to be changed while boards are being manufactured using parts from the related reel. Thus, the "event" that could introduce a change in the manufacturing process would occur when the assembly machine began using parts from a new reel, not necessarily when the new reel was loaded on the machine.

Also, it should be appreciated that the event, rather than triggering additional inspection of parts from a new reel, might alternatively trigger a program that does not inspect those components or does not classify a board as faulty regardless of what the inspection shows. This might be most useful in the case where AOI is used. For example, a manufacturer might buy a diode that is functionally equivalent to one that was used when the AOI machine was programmed, but looks different. Consequently, the AOI machine is not programmed to determine whether the correct part is being placed on the board. The event might trigger the AOI machine to skip over parts of this type so that it will not automatically classify these boards as faulty. Further inspection might be performed later to validate that the skipped over components were actually correctly installed. Or, the event might trigger the AOI machine to store an image of the new part into the library of part images so that it can detect, for subsequent boards, whether that part is installed correctly.

Alternatively, the event might be an indication from an inspection machine that all of the parts of a particular part type fail to match the expected part. The event message might be sent to other equipment in the assembly line to cause those boards to be segregated until the source of the problem was found.

Also, it is pictured that each piece of equipment in the production line has its own controller. Such an architecture is not necessary. Similar results can be achieved from an architecture in which a computer serves as the controller for multiple pieces of equipment.

Other variations might include the type of communications network used to communicate between the various pieces of equipment. A hard wired network might be used. Or, a wireless or optical network could also be used. Further, it might not be necessary for the communication to take place electrically or electroptically. Information might, for example, be encoded on tags attached to the assemblies or otherwise passed through the system. In this way, the communication network could function by passing information on the tags.

Therefore, the invention should be limited only by the spirit and scope of the appended claims.

What is claimed is:

1. An production line adapted for dynamic testing of electronic assemblies, comprising:
    a) at least one assembly machine;
    b) at least one inspection machine, programmed with at least a first program and a second program for identifying defects on electronic assemblies produced by the assembly machine;
    c) a communication network passing information between the assembly machine and the inspection machine;
    d) wherein the communication network passes information from the assembly machine to the inspection machine concerning an event that could cause defects in the manufacture of the electronic assemblies; and
    e) wherein, in response to receiving the indication of the event, the at least one inspection machine switches from using the first program to using the second program to inspect electronic assemblies.

2. The production line of claim 1 wherein the first program is a sampling program.

3. The production line of claim 1 wherein the first program inspects different regions on successive electronic assemblies.

4. The production line of claim 1 wherein the at least one assembly machine comprises a pick and place machine.

5. The production line of claim 1 wherein the at least one inspection machine comprises an AOI machine.

6. The production line of claim 1 wherein the at least one inspection machine comprises an AOI machine and a pick and flying prober machine.

7. The production line of claim 1 wherein the at least one inspection machine comprises a flying prober machine.

8. A method of manufacturing printed circuit boards using the production line of claim 1 comprising:
    a) assembling a board with the assembly machine;
    b) selecting one of the first program and the second program in response to an indication of an event; and
    c) inspecting the board with the inspection machine using the selected program.

9. An production line adapted for dynamic testing of electronic assemblies, comprising:
    a) at least one assembly machine;
    b) at least one inspection machine, programmed with at least a first program and a second program for identifying defects on electronic assemblies produced by the assembly machine;
    c) a communication network passing information between the assembly machine and the inspection machine;
    d) wherein the communication network passes information from the assembly machine to the inspection machine concerning an event that could cause defects in the manufacture of the electronic assemblies; and
    e) wherein, in response to receiving the indication of the event, the at least one inspection machine switches from using the first program to using the second program to inspect electronic assemblies,
    wherein:
        i) the at least one inspection machine comprises at least two inspection machines and
        ii) the production line additionally comprises a switch routing electronic assemblies to the second assembly machine in response to the event; and
        iii) the second program runs on the second inspection machine.

10. An inspection machine adapted for use in a production line capable of performing dynamic testing of electronic assemblies, comprising:
    a) inspection apparatus selected from the class consisting of AOI and flying prober;
    b) a controller, connected to the inspection apparatus, the controller having:
        i) at least a first software program and a second software program;
        ii) a connection to a communications network;
        iii) software adapted to receive event messages over the communications network and to select either the first program or the second program in response to an event message;
        iv) wherein an event is a change in the process for manufacturing electronic assemblies selected from the group consisting of a reel change and a jam.

11. The inspection machine of claim 10 wherein the first software program is adapted to inspect different regions of successive electronic assemblies and the second software program is adapted to inspect specific components on the electronic assemblies.

12. The inspection machine of claim 11 wherein the specific component inspected by the second program are selected in response to the event message.

13. The inspection machine of claim 10 wherein the communications network comprises a GEM network.

14. An inspection machine adapted for use in a production line capable of performing dynamic testing of electronic assemblies, comprising:
  a) inspection apparatus;
  b) a controller, connected to the inspection apparatus, the controller having:
    i) at least a first software program and a second software program;
    ii) a connection to a communications network;
    iii) control software adapted to receive event messages over the communications network and to select either the first program or the second program in response to an event message;
    iv) wherein the event message includes an indicator of an electronic assembly affected by the event and the time at which the control software selects between the first program and the second program is determined by the time at which said electronic assembly is inspected.

15. The inspection machine of claim 14 wherein the first software program is adapted to inspect different regions of successive electronic assemblies and the second software program is adapted to inspect specific components on the electronic assemblies.

16. The inspection machine of claim 15 wherein the specific component inspected by the second program are selected in response to the event message.

17. The inspection machine of claim 14 wherein the communications network comprises a GEM network.

18. The inspection apparatus of claim 14 wherein the inspection apparatus is selected from the class consisting of AOI and flying prober.

19. The inspection machine of claim 14 wherein the first program is a sampling program.

20. The inspection machine of claim 14 wherein the first program inspects different regions on successive electronic assemblies and the second program is used on the first assembly affected by the event and a plurality of assemblies in sequence thereafter.

* * * * *